United States Patent [19]
Merchant

[11] Patent Number: 6,096,606
[45] Date of Patent: Aug. 1, 2000

[54] METHOD OF MAKING A SEMICONDUCTOR DEVICE

[75] Inventor: Steven L. Merchant, Phoenix, Ariz.

[73] Assignee: Motorola, Inc., Schaumburg, Ill.

[21] Appl. No.: 09/072,256

[22] Filed: May 4, 1998

[51] Int. Cl.[7] .................................. H01L 21/336
[52] U.S. Cl. .................... 438/268; 438/273; 438/212; 257/336; 257/339; 257/342; 257/343; 257/335
[58] Field of Search ................. 257/336, 339, 257/342, 343, 335; 438/268, 212, 273

[56] References Cited

U.S. PATENT DOCUMENTS

| | | |
|---|---|---|
| 4,290,077 | 9/1981 | Ronen . |
| 5,430,316 | 7/1995 | Contiero et al. ................ 257/335 |
| 5,485,027 | 1/1996 | Williams et al. ................ 257/343 |
| 5,517,046 | 5/1996 | Hsing et al. ..................... 257/336 |
| 5,689,128 | 11/1997 | Hshieh et al. . |
| 5,814,858 | 9/1998 | Williams ......................... 257/328 |

OTHER PUBLICATIONS

S. Wolf, Silicon Processing for the VLSI Era, vol. 2 Process Integration, pp. 486–489, Lattice Press, 1990.

*Primary Examiner*—Matthew Smith
*Assistant Examiner*—Belur O Keshavan
*Attorney, Agent, or Firm*—Daniel R. Collopy; Robert F. Hightower

[57] ABSTRACT

A semiconductor device (10) is formed in a semiconductor substrate (11) and an epitaxial layer (14). The semiconductor device includes a p-type body region (16), a source region (17), a channel region (19), and a drain region (102) formed in the epitaxial layer (14). Doped regions (20,22) are formed in the epitaxial layer (14) that contain dopant of a conductivity type that is opposite to the epitaxial layer (14). The doped regions (20,22) divide the epitaxial layer (14) to provide or define doped regions (21,23). The doped regions (20,22) are formed from a plurality of doped regions (30, 31,32,33) that can be formed with high energy implants.

5 Claims, 5 Drawing Sheets

METHOD OF MAKING A SEMICONDUCTOR DEVICE

BACKGROUND OF THE INVENTION

This invention relates to a previously filed Patent Application that has Ser. No. 09/055,119. Both applications were filed by the same inventive entity and are assigned to the same assignee.

This invention relates, in general, to semiconductor devices, and more particularly, to transistors having high breakdown voltage and low "on" resistance.

The design and fabrication of semiconductor devices involves the balancing of various electrical parameters to provide a device that meets the requirements of a particular customer. With power transistors, two of the most important electrical parameters are breakdown voltage and "on" resistance. Breakdown voltage (BV) generally refers to the maximum voltage that can be placed between the source and drain of a transistor while the transistor is in an "off" or non-conducting state (i.e., the voltage on the gate is less than the threshold voltage of the device). "On" resistance, also referred to as $R_{ds}$ on, is the resistance measurement between the drain and source terminals of a transistor when the transistor is in a conductive state (i.e., the voltage on the gate is equal to or greater than the threshold voltage of the device).

Historically, to increase the breakdown voltage of a lateral power transistor, the amount of dopant between the source and drain regions near the surface of the substrate is reduced. However, the reduction in dopant concentration results in an increase in the "on" resistance ($R_{ds}$ on) between the source and drain terminals. Conversely, with everything else being equal, improvements in $R_{ds}$ on typically result in a device that has a lower breakdown voltage.

Accordingly, a need exists to provide a semiconductor device that has either improved breakdown voltage or $R_{ds}$ on without compromising the other parameter.

Figure 1:
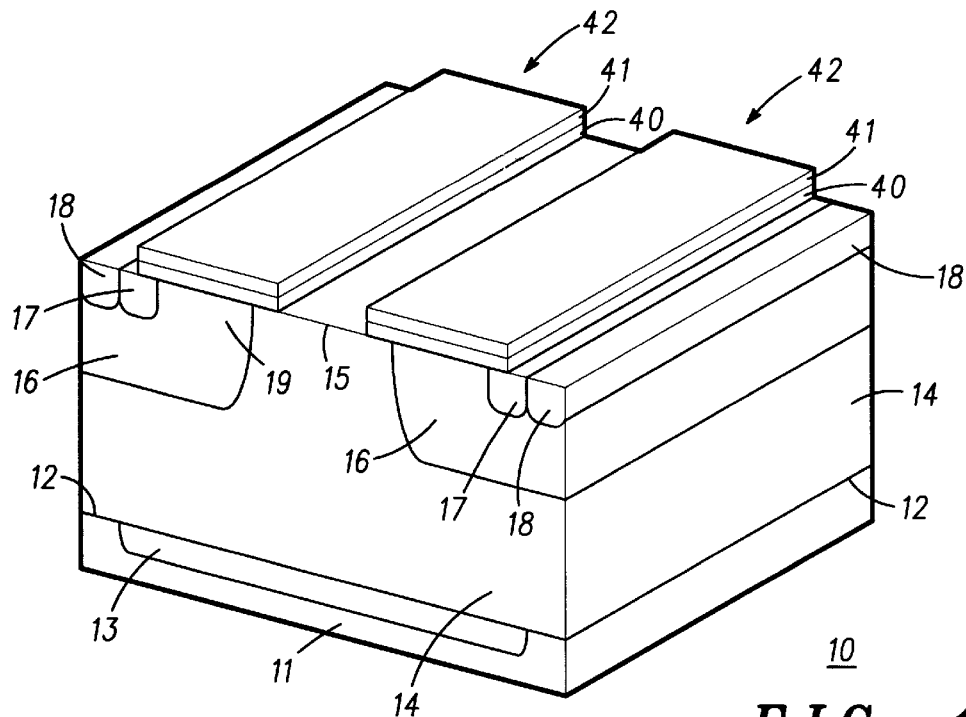
FIGS. 1–2 are three-dimensional views of a semiconductor device at various stages in a manufacturing process in accordance with an embodiment of the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION OF THE DRAWINGS

FIG. 1 is a three dimensional representation of a portion of a semiconductor device 10 at an early stage of manufacture in accordance with an embodiment of the present invention. As shown in the example that follows, semiconductor device 10 is in an n-channel configuration. However, one skilled in the art will appreciate that a p-channel device can be formed by changing n-type regions to p-type regions and vice-versa. In addition, semiconductor device 10 can be either a discrete device as shown or represent a base unit cell that is repeated longitudinally to form a larger device having a greater current carrying capability.

The process for forming semiconductor device 10 in accordance with the example shown in FIG. 1 begins by providing a semiconductor substrate 11 that is preferably of p-type conductivity with a sheet rho ranging from about 0.001 ohm-centimeters (cm) to 10 ohm-cm. A buried doped region or a doped region 13 is then formed using a doping or ion implantation process. For example, a conventional photolithographic process is used to form an implantation mask (not shown) that exposes the portion of semiconductor substrate 11 that is to be implanted. Thereafter, an n-type dopant such as phosphorus or arsenic is implanted into the exposed portions of semiconductor substrate 11 with an energy ranging from about 50 keV to 150 keV and a dose ranging from about $1 \times 10^{15}$ atoms/centimeter$^2$ (cm$^2$) to $5 \times 10^{15}$ atoms/cm$^2$.

As shown in FIG. 1, doped region 13 extends from a substrate surface or a surface 12 of semiconductor substrate 11. However, it should be understood that the implant energy used to form doped region 13 could be increased so that doped region 13 is buried in semiconductor substrate 11 so as not to be in contact with surface 12 (i.e., doped region 13 is separated from the surface 12 of semiconductor substrate 11). It should also be understood that the use of an ion implantation mask is optional as a blanket implant could be used to form doped region 13.

As will be explained in more detail below, substrate 11 serves as a backside drain contact for semiconductor device 10. Accordingly, it may be desirable to form semiconductor substrate 11 from heavily doped n-type material rather than form doped region 13 in a p-type substrate. Therefore, all of semiconductor substrate 11 would serve as doped region 13.

Thereafter, a layer of epitaxial silicon or an epitaxial layer 14 is grown on the surface 12 of semiconductor substrate 11. Preferably, epitaxial layer 14 is n-type with a doping concentration ranging from about $1 \times 10^{14}$ atoms/cm$^3$ to $1 \times 10^{17}$ atoms/cm$^3$. A conventional deposition process can be used to form epitaxial layer 14 so that epitaxial layer 14 has a thickness ranging from about 5,000 angstroms (Å) to 10 microns ($\mu$m). The thickness and doping concentration of epitaxial layer 14 can be varied with experimentation to adjust the breakdown voltage capability of semiconductor device 10. As shown in FIG. 1, epitaxial layer 14 is formed on the surface 12 of semiconductor substrate 11. However, it is also possible to form other layers (e.g., other epitaxial layers) between epitaxial layer 14 and semiconductor substrate 11 so that epitaxial layer 14 is overlying semiconductor substrate 11.

Additionally, in some applications the use of epitaxial layer 14 can be considered optional. In cost sensitive applications, epitaxial layer 14 can replaced by forming an implanted region within semiconductor substrate 11. However, such a modification is not likely to appreciate all the advantages of the present invention.

A p-type body region 16 is then formed in epitaxial layer 14 by implanting epitaxial layer 14 with a p-type dopant such as boron through an implantation mask , (not shown). Preferably, p-type body region 16 extends from the epitaxial surface or surface 15 of epitaxial layer 14 and is positioned so that at least a portion of p-type body region 16 is overlying doped region 13. A source region 17 is then formed by implanting a portion of p-type body region 16 with an n-type dopant through an implantation mask (not shown). As shown in FIG. 1, source region 17 is formed such that it is contained with p-type body region 16 so that a portion of p-type body region 16 physically and electrically isolates source region 17 from epitaxial layer 14. This portion of p-type body region 16 is hereinafter referred to as a channel region 19.

Optionally, a heavily doped p-type region 18 can be formed in p-type body region 16. Preferably, region 18 is formed so that it contacts source region 17 and fills p-type body region 16 with the exception of channel region 19. Doped region 18 is optionally used for two reasons. First, the additional dopant serves to reduce the contact resistance of the electrical contact that is subsequently made to source region 17. Secondly, doped region 18 shorts the base to the emitter of the parasitic bi-polar transistor that inherently exists with source region 17, p-type body region 16, and epitaxial layer 14, acting as the emitter, base, and collector regions, respectively.

Thereafter, a gate structure 42 is formed so gate structure 42 is overlying at least a portion of channel region 19. Preferably, gate structure 42 covers all of channel region 19 and overlaps portions of source region 17 and epitaxial layer 14 as shown in FIG. 1. Gate structure 42 can comprise a layer of dielectric material 40, such as silicon dioxide, and a conductive layer 41, such as polysilicon, amorphous silicon, silicide, or the like. It should be noted that the use of photolithograph implantation, deposition, and etch processes to form regions 16–18, gate structure 42, and epitaxial layer 14 are well known in the art. It should also be understood that gate structure 42 could be formed prior to the formation of p-type body region 16 and source region 17 so that the implantation steps would be self-aligned to gate structure 42. As shown in FIG. 1, gate structure 42 is divided into two portions that each cover a portion of a p-type body region 16. This should be considered optional as it is also possible to form gate structure 42 so that it is continuous across the surface 15 of epitaxial layer 14. The manufacture of semiconductor device 10 continues with reference to FIG. 2.

Figure 2:
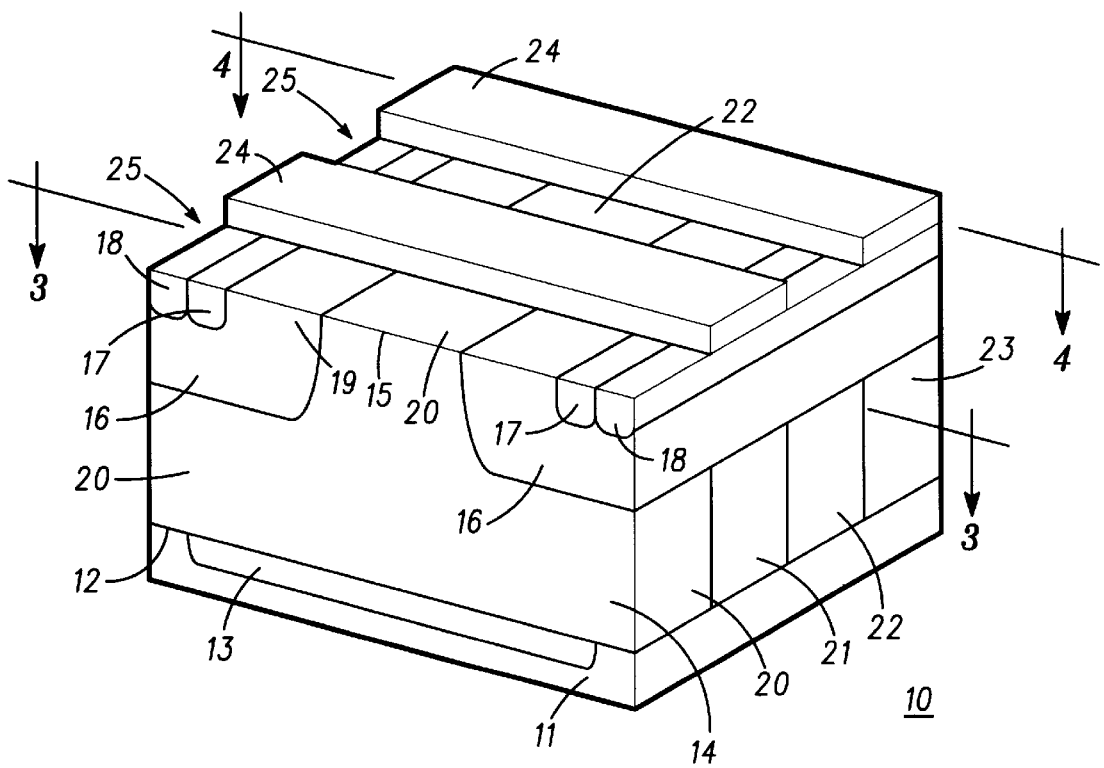
Figure 3:
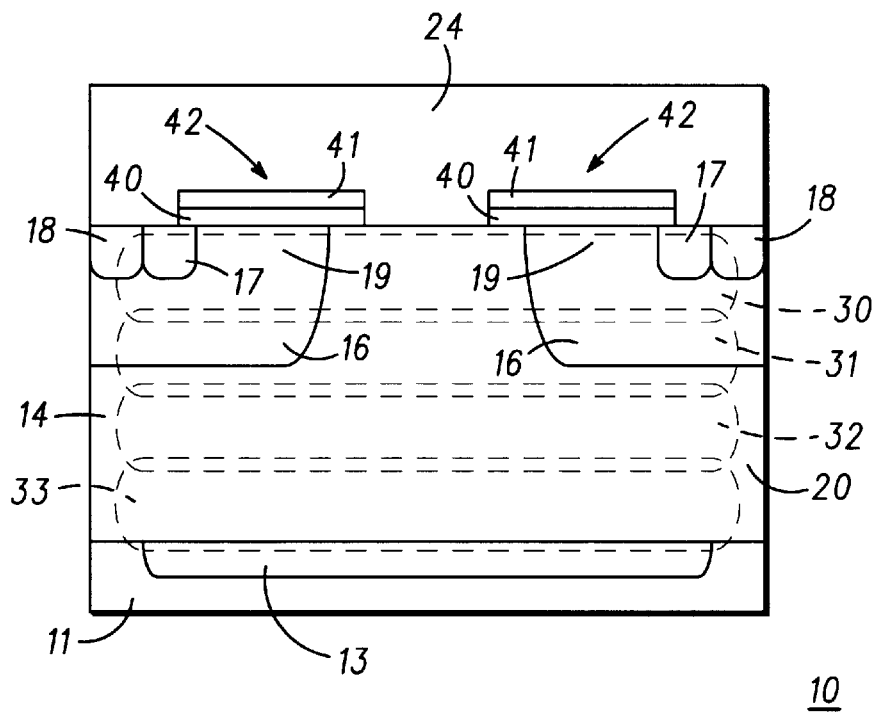
FIGS. 3–4 are cross-sectional views of the semiconductor device shown in FIG. 2.
Figure 4:
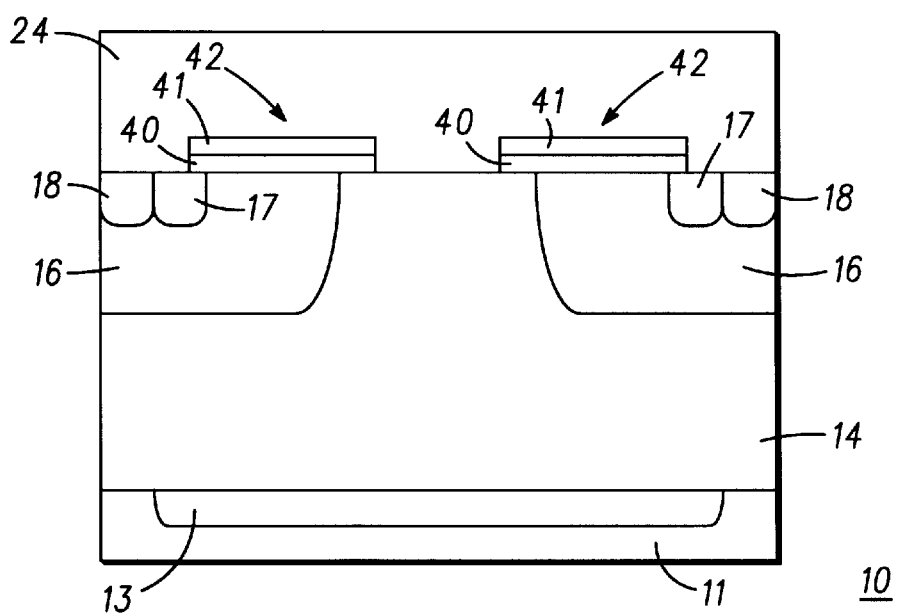

FIG. 2 is a three dimensional representation of a portion of semiconductor device 10 after further processing in accordance with the current embodiment of the present invention. Sectional lines 3—3 and 4—4 are used to represent the cross-sections of semiconductor device 10 that are illustrated in FIGS. 3 and 4, respectively. It should be noted that FIG. 2 omits gate structure 42, which is shown in FIGS. 3 and 4, for clarity.

A masking layer 24, such as a layer of photoresist, is then formed over the surface 15 of epitaxial layer 14. Masking layer 24 has openings 25 that expose the portion of epitaxial layer 14 where doped regions 20 and 22 are to be subsequently formed in epitaxial layer 14. Doped regions 20 and 22 are formed so that they extend from the surface 15 of epitaxial layer 14 and contact doped region 13. This is accomplished in the present invention by performing a plurality of relatively high energy ion implantation processes that form a plurality of doped regions 30–33 in epitaxial layer 14. The plurality of doped regions 30–33 that provide doped region 20 are only illustrated in FIG. 3 for clarity.

For example, if epitaxial layer 14 is about 3 microns thick, then it would be desirable to form doped region 20 with four doped regions 30–33 as shown in FIG. 3. Accordingly, as the thickness of epitaxial layer 14 increases, additional doped regions would be necessary to form doped region 20. Conversely, as the thickness of epitaxial layer 14 is reduced, fewer doped regions would be necessary. The dashed portions of doped regions 30–33 are used to indicate the overlap between the various doped regions 30–33 to provide doped region 20. Once formed, the plurality of doped region 30–33 serve to doped epitaxial layer 14 to provide doped region 20 as shown in FIG. 2. It should also be noted that as doped region 30–33 are formed, similar doped regions are simultaneously formed to provide doped region 22 (see FIG. 2).

In the preferred embodiment, each of doped regions 30–33 is formed by implanting epitaxial layer 14 through the opening 25 in masking layer 24 using high energy implants at various energies. Doped region 33 can be formed by implanting epitaxial layer 14 (indicted in FIG. 3 with arrows 26) with a p-type dopant such as boron at an energy ranging from about 2.5 MeV to 5 MeV and a dose ranging from about $1 \times 10^{13}$ atoms/centimeter$^2$ (cm$^2$) to $5 \times 10^{15}$ atoms/cm$^2$. Doped region 32 is then formed by implanting a p-type dopant at an energy ranging from about 1.5 MeV to 3 MeV and a dose ranging from about $1 \times 10^{13}$ atoms/cm$^2$ to $5 \times 10^{15}$ atoms/cm$^2$. Doped region 31 is then formed by implanting a p-type dopant at an energy ranging from about 0.5 MeV to 1 MeV and a dose ranging from about $1 \times 10^{13}$ atoms/cm$^2$ to $5 \times 10^{15}$ atoms/cm$^2$. Finally, doped region 30 is formed by implanting a p-type dopant at an energy ranging from about 100 keV to 1 MeV and a dose ranging from about $1 \times 10^{13}$ atoms/cm$^2$ to $5 \times 10^{15}$ atoms/cm$^2$.

As shown in FIG. 4, the portion of epitaxial surface 15 that is covered with masking layer 14 prevents the underlying portion of epitaxial layer 14 from being doped as doped region 30–33 are formed. Therefore, the portions of epitaxial layer 14 that are not implanted provide an doped regions 21 and 23. However, if epitaxial layer 14 was formed from intrinsic, undoped silicon, an additional masking layer and similar multiple implantation process could be used to form a plurality of doped regions to provide n-type doped region 21 and 23.

Following the implantation sequence, masking layer 24 is removed and an anneal step is performed to activate the implanted dopant and to form doped regions 20 and 22 with the doping profile shown in FIG. 2. For example, an anneal in an inert ambient at about 950° Celsius (C) to 1150° C. for about 30 seconds to 45 minutes can be used to activate the implanted dopant. It is also possible to omit the designated anneal step and rely on subsequent high temperature processing steps to achieve an equivalent effect.

Preferably, doped regions 30–33 are formed in the sequence described above using the same dopant species for each of doped regions 30–33. In addition, doped regions 30–33 are preferably formed after the formation of source region 17 and gate structure 42 so as to minimize the amount of high temperature processing that doped regions 20 and 22 are exposed to. However, it should be understood that doped region 20 could be formed prior to formation of the other elements shown in FIG. 2. It is also possible to form doped regions 30–33 in reverse or different order, and it is possible to use a different dopant species for each of doped regions 30–33.

Figure 5:
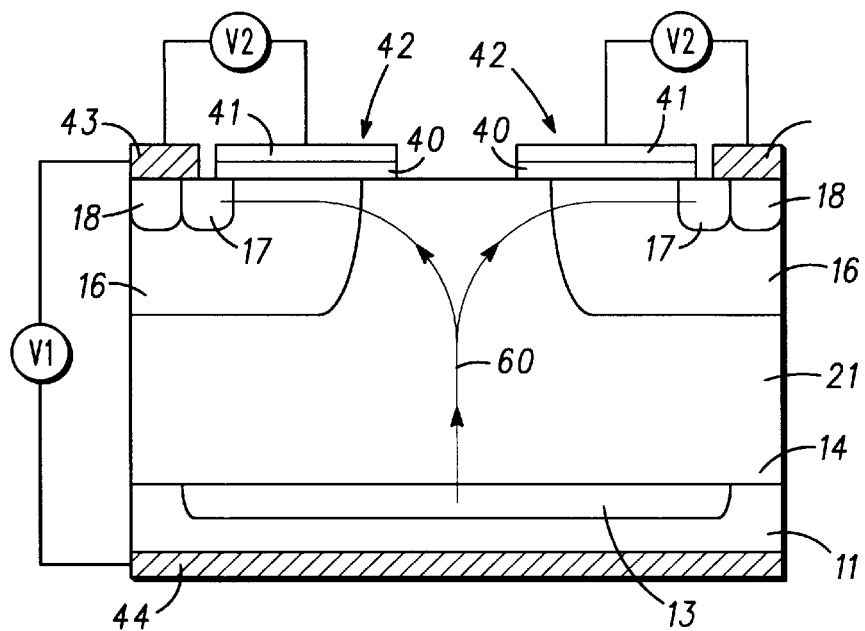
FIG. 5 is a cross-sectional view of the semiconductor device after further processing.

Turning now to FIG. 5, the process of forming semiconductor device 10 in accordance with the present invention is completed by forming a source contact 43 and a drain contract 44 using conventional metallization techniques known in the art. Source contact 43 is electrically connected to source region 17 and drain contact 44 is electrically connected to doped region 13, which in turn is coupled to doped regions 21 and 23.

An explanation is now provided as to how the formation of doped regions 20 and 22 in accordance with the present invention provides for a reduction in the "on" resistance ($R_{ds}$ on) of semiconductor device 10 without adversely affecting the breakdown voltage of semiconductor device 10. To operate semiconductor device 10, a voltage potential (e.g., about 0.1 volts to 5 volts, indicated in FIG. 5 by V1) is placed between source contact 43 and drain contact 44, respectively. An enabling voltage (e.g., about 3 volts to 20 volts, indicated in FIG. 5 by V2) is then placed between gate structure 42 and source region 17, thereby generating a response signal (i.e., a current flow). The enabling voltage is used to invert channel region 19 and transform semiconductor device 10 from a non-conducting to a conducting state. In the conductive state, a current flow passes between drain contact 44 and source region 17 to provide a response signal. The general direction of the current flow is indicated in FIG. 5 with an arrow 60.

Traditionally, the "on" resistance ($R_{ds}$ on) of a device would be reduced by increasing the amount of dopant that is contained within the epitaxial layer. However, the increase in the dopant reduces the blocking voltage capability of the device between its source and drain regions. In other words, the breakdown voltage is reduced in proportion to the amount of improvement gained in the reduction in $R_{ds}$ on. However, the formation of doped regions 20 and 22 so that they are in contact with, or at least in close proximity to, doped regions 21 and 23 compensates for the increased presence of dopant in epitaxial layer 14 without affecting the breakdown voltage of semiconductor device 10.

Ideally, the quantity of dopant contained in doped regions 20 and 22 is approximately equal to the quantity of dopant contained in doped regions 21 and 22. By having an equal amount of dopant of the opposite conductivity types within close proximity of each other, the p-type dopant in doped regions 20 and 22 can deplete or compensate for the n-type dopant in doped regions 21 and 23 when semiconductor device 10 is in a non-conducting state. Consequently, the breakdown voltage of semiconductor device 10 is not affected. Therefore, the present invention allows the doping concentration of epitaxial layer 14 to be increased so that the $R_{ds}$ on of semiconductor device 10 can be reduced while maintaining the same breakdown voltage value.

It should be understood that the amount dopant in doped regions 20 and 22 depends on the volume and doping concentration of the n-type dopant of doped region 21 and 23. It should also be understood that the quantity of dopant in doped regions 20 and 22 need not be equal to the dopant in doped regions 21 and 23 to appreciate the benefits of the present invention. By tolerating some reduction in breakdown voltage, the amount of dopant in doped regions 20 and 22 could be less than the amount of dopant in doped regions 21 and 23.

Figure 6:
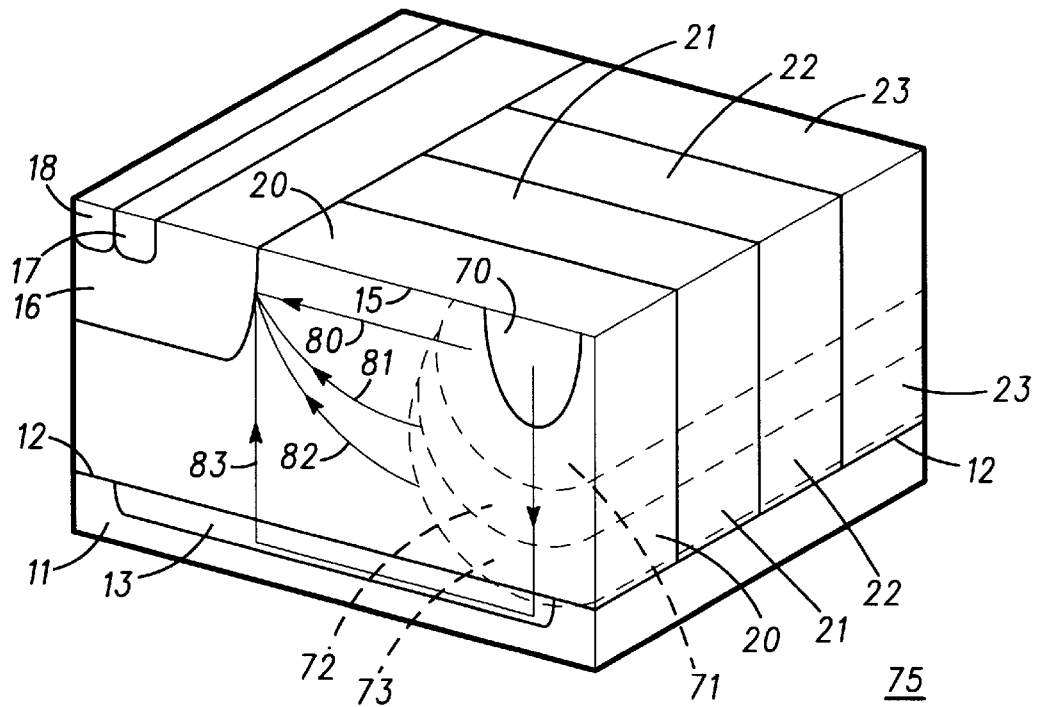
FIG. 6 is a three-dimensional view of a semiconductor device in accordance with an alternative embodiment of the present invention.

Turning now to FIG. 6, a semiconductor device 75 is described in an alternative embodiment of the present invention. It should be noted that gate structure 42 has been omitted from FIG. 6 for clarity. The use of doped p-type layers between n-type doped regions can also be used to benefit lateral devices as well. Semiconductor device 75 is a lateral device that provides a flow of current between source region 17 and a drain region 70, through doped regions 20 and 23, when in a conducting state. The current flow is indicated in FIG. 6 with an arrow 80. However, for clarity, arrow 80 is shown to be in doped region 20 because of the limitations of showing the current flow in a three-dimensional figure. One skilled in the art will appreciate that current does not flow through doped regions 20 or 21, but rather through doped regions 21 and 23.

The drift resistance of semiconductor device 75 is predominantly determined by the amount of dopant that is present in doped regions 21 and 23 near the epitaxial surface 15. The drift resistance of semiconductor device 75 can be reduced by increasing the doping of epitaxial layer 14. The potentially detrimental effect to the breakdown performance of semiconductor device 75 is then offset by the presence of doped regions 20 and 22, which deplete the dopant in doped regions 21 and 23 when semiconductor device 75 is in a non-conducting state.

Semiconductor device 75 can also be benefited with the formation of multiple doped regions 71–73 (indicated with dashed lines) to further reduce the drift resistance. Each of doped regions 71–73 provides a low resistance path for current to flow from drain region 70 to p-type body region 16 when semiconductor device 75 is in a conducting state. The current path provided by each of doped regions 71–73 is indicated in FIG. 6 with arrows 80–82. In addition, the combination of doped regions 70–73 and doped region 13 provides a low resistance path so that current can flow down doped regions 70–73, across doped region 13, and then vertically to p-type body region 16. This current path is indicated in FIG. 6 with an arrow 83. Again, arrows 81–83 are shown to be in doped region 20 for clarity when the actual current flow is through doped regions 21 and 23.

As shown in FIG. 6, doped region 71–73 are formed with ever increasing width to further reduce the drift resistance. This is accomplished by implanting epitaxial layer 14 under similar conditions as is used to form doped region 20, but using different photolithographic masks for each of doped regions 71–73. It is also possible to use the same implantation mask so that each of doped regions 71–73 has substantially the same width. The profile shown in FIG. 6 can also be achieved by performing a similar process described above with reference to FIG. 3, but by performing an anneal step after each implantation step. To do this, the implantation masking layer would have to be removed prior to each anneal, but at least the same photolithographic mask could be used each time to reform the masking layer.

In addition, a doping profile similar to that shown in FIG. 6 can be formed by adjusting the angle of the implant relative to the surface 15 of epitaxial layer 14. The implant shown in FIG. 1 with arrows 26 was performed at a 0° angle (i.e., the direction of the ion is orthogonal to the surface 15 of epitaxial layer 14). Instead, the profile shown in FIG. 6 could be formed by adjusting the angle of the implant from about 3° to 14° relative to the surface 15 of epitaxial layer 14.

The formation of doped regions 13 and 71–73 reduce the drift resistance of semiconductor device 75 between drain region 70 and p-type body region 16. In other words, doped regions 70–73 and doped region 13 provide alternative paths for the current flow that reduces the net resistance value between drain region 70 and source region 17. Simply stated, doped regions 70–73 and doped region 13 provide an additional path for current that is substantially orthogonal to doped region 13 (arrow 83). This current path is in addition to the lateral or horizontal path that is substantially parallel to the surface 15 of epitaxial layer 14 (arrow 80). Even though the horizontal component is preferably greater than or equal to the vertical component, the current path provided by doped region 13 reduces the net drift resistance of semiconductor device 75. As a result, the "on" resistance or $R_{ds}$ on of semiconductor device 75 is further appreciably reduced.

The amount of the reduction in $R_{ds}$ on can be significant compared to conventional lateral devices depending on the location and doping concentrations of doped regions 70–73 and doped region 13. In many applications, the reduction in $R_{ds}$ on of semiconductor device 75 can exceed 25% versus conventional lateral power devices. Moreover, the presence of doped regions 70–73 and doped region 13 does not adversely affect the breakdown voltage of semiconductor device 75. Thus, the present invention provides a structure that reduces the $R_{ds}$ on of a device, without compromising its breakdown voltage.

It should be understood that the advantages of the present invention could instead be used to increase the breakdown voltage of a device while maintaining the same $R_{ds}$ on value. This can be accomplished by forming the same structure shown as in FIG. 6, but by increasing the distance between doped regions 70–73 and p-type body 16 and between p-type body region 16 and doped region 13. By increasing these distances, the breakdown voltage of semiconductor device 75 is increased. In conventional devices, this would also increase the $R_{ds}$ on of the device due to the longer current path from the drain terminal to the source terminal. However, the use of doped regions 70–73 and doped region 13 in the present invention helps offset for the longer current path and provides a device with a higher breakdown voltage, but the same $R_{ds}$ on value.

Figure 7:
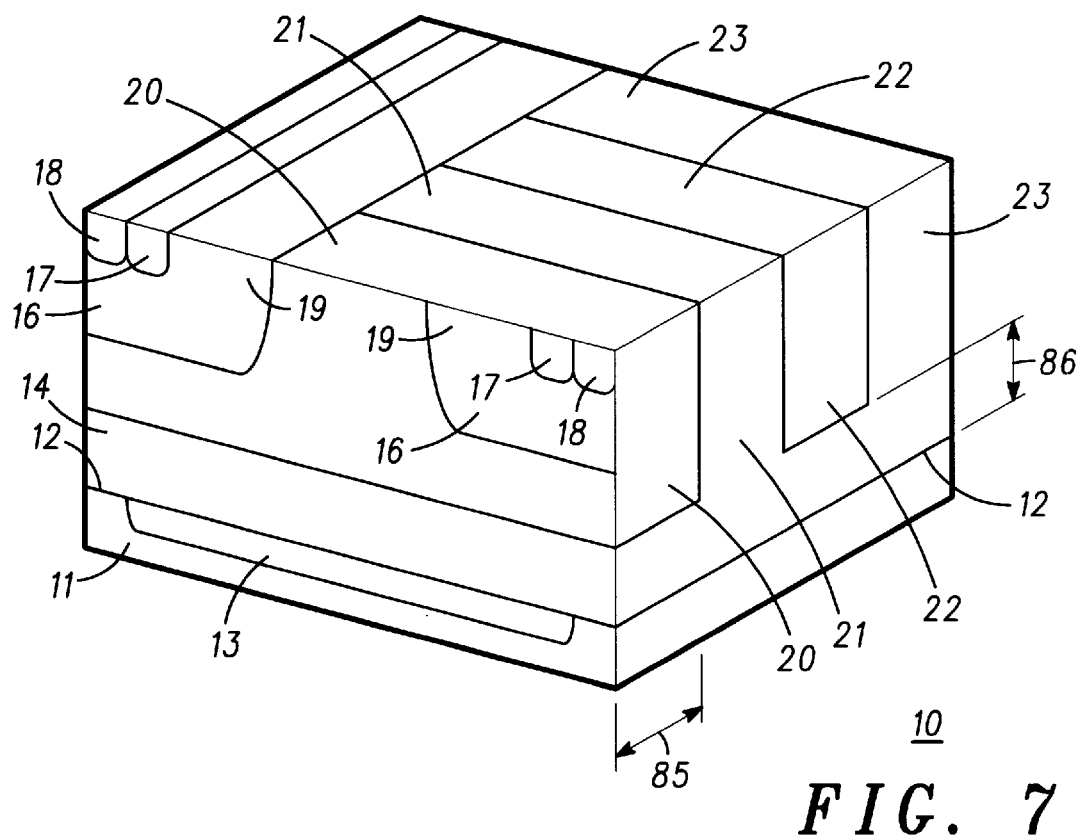
FIG. 7 is a three-dimensional view of a semiconductor device in accordance with another alternative embodiment of the present invention.

As shown in FIG. 2, doped region 20 and 22 extend from epitaxial surface 15 so that they come in contact with semiconductor substrate 11 or doped region 13. It should be noted that it may be desirable to form doped regions 20 and 22 so that they are separated from doped region 13 as shown in FIG. 7. To minimize the effects of the electric field present near doped region 13 when a semiconductor device is in a conducting state, it may be desirable to have doped regions 20 and 22 separated from doped region 13 a distance (shown as a bracket 86) that is approximately equal to the width of doped regions 20 and 22 (shown as a bracket 85). Other distances are possible depending upon the needs and tolerances of each particular customer's application.

Figure 8:
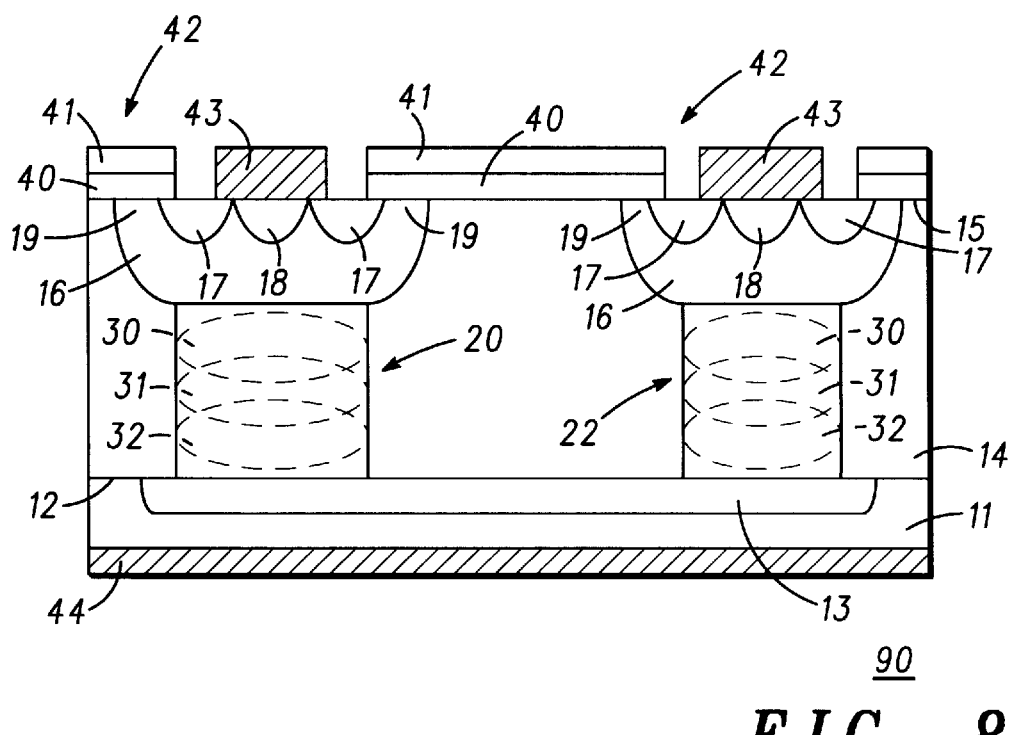
FIG. 8 is a cross-sectional view of a semiconductor device in accordance with yet another embodiment of the present invention.
Figure 9:
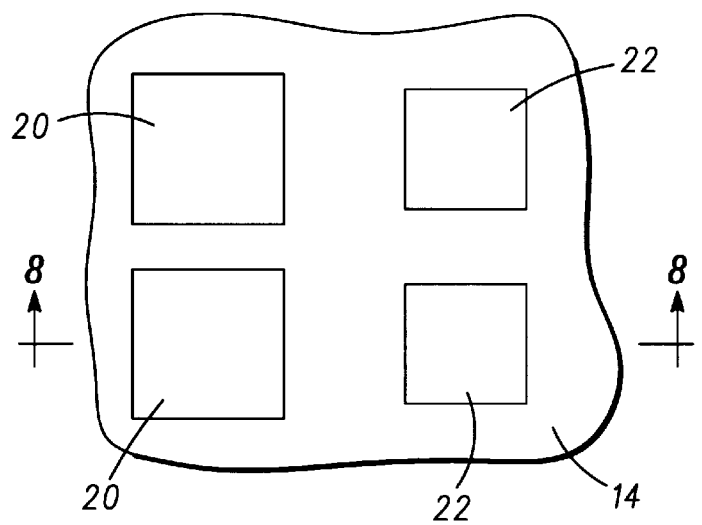
FIG. 9 is a top view of the semiconductor device shown in FIG. 8.

Turning now to FIG. 8, a semiconductor device 90 in accordance with yet another alternate embodiment is now provided. Doped regions 20 and 22 can also be formed so that they extend from p-type body regions 16 rather than from epitaxial surface 15. FIG. 9 is a top view of semiconductor device 90 and is provided to help demonstrate how semiconductor device 90 is arranged in a repeating cell structure. Only the relative location of epitaxial layer 14 and doped regions 20 and 22 is shown in FIG. 9. Using the techniques described earlier, doped regions 20 and 22 are formed from a plurality of ion implantation steps that form doped regions 30–32. Depending on the thickness of epitaxial layer 14, the number of doped regions 30–32 can vary. Similar to the benefit achieved with the device shown in FIG. 2, the dopant contained within doped regions 20 and 22 depletes the n-type dopant in epitaxial layer 14 when semiconductor device 90 is in a non-conducting state. Therefore, the doping concentration of epitaxial layer 14 can be increased to reduce $R_{ds}$ on without adversely affecting the breakdown voltage of semiconductor device 90.

It is also possible to form semiconductor device 90 without the use of p-type body regions 16 by simply increasing the number of doped regions that are used to form doped regions 20 and 22 so that doped regions 20 and 22 provide both channel region 19 and the dopant necessary to compensate for the doping concentration of the surrounding epitaxial layer 14.

Figure 10:
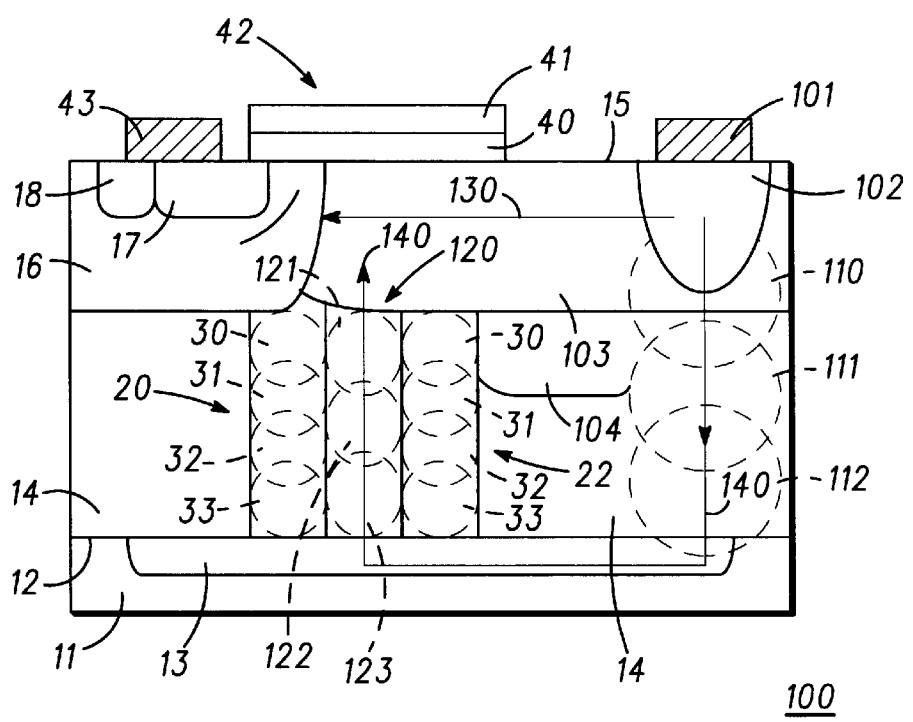
FIG. 10 is a cross-sectional view of a semiconductor device in accordance with yet another alternate embodiment of the present invention.

Referring now to FIG. 10, yet another alternative embodiment of the present invention is provided. As shown in FIG. 10, semiconductor device 100 is a lateral device in that gate structure 42 is used to modulate a current flow (indicated in FIG. 10 with an arrow 130) between source region 17 and a drain region 102, which are both on the topside of semiconductor device 100. Drain region 102 is formed so as to be extending from the surface of epitaxial layer 14 and electrical contact is made from the topside of semiconductor device 100 with a drain contact 101.

In this example, epitaxial layer 14 is made from undoped, intrinsic silicon so as to control the direction of the flow of current between source region 17 and drain region 102. An n-type doped region 103 is formed in epitaxial layer 14 to reduce the drift resistance between p-type body region 16 and drain region 102. For example, doped region 103 can be formed by selectively implanting epitaxial layer 14 with an n-type dopant at an energy ranging from about 100 keV to 1.0 MeV and a dose ranging from about $1 \times 10^{11}$ atoms/cm$^2$ to $2 \times 10^{14}$ atoms/cm$^2$. As shown in FIG. 10, doped region 103 is preferably formed so that it contacts both p-type body region 16 and drain region 102. This is desirable if epitaxial layer 14 is relatively undoped. However, it is possible to form doped region 103 so that it is positioned between the drain region 102 and the p-type body region 16, and only contacts just one or none of the adjacent regions if desired. It should be noted that the amount overlap between doped region 103 and p-type body region 16 will directly reduce the breakdown voltage of semiconductor device 100.

To help offset the effect that doped region 103 has on the breakdown voltage of semiconductor device 100, a doped region 104 can be formed by implanting a p-type dopant, such as boron, at an energy ranging from about 100 keV to 1 MeV and a dose ranging from about $1 \times 10^{11}$ atoms/cm$^2$ to $1 \times 10^{14}$ atoms/cm$^2$. Preferably, doped region 104 is formed so that it is juxtaposed to doped region 103 along the horizontal direction as shown in FIG. 10. It is also possible to form doped region 104 so that it is positioned between the surface 15 of epitaxial layer 14 and doped region 103, or within doped region 103, if desired.

Semiconductor device 100 also has a vertical doped region 120 that extends from doped region 103 through epitaxial layer 14 to doped region 13. A plurality of high energy implant steps are used to form doped regions 121–123 (indicated in FIG. 10 with dashed lines), which are used to provide doped region 120. For example, an implantation mask (not shown) is formed on the epitaxial surface 15 so that only the portions of epitaxial layer 14 that are to be doped are exposed.

Thereafter a sequence of implantation steps are used to form doped region 121–123. Doped region 123 can be formed by implanting epitaxial layer 14 with an n-type dopant such as phosphorus or arsenic at an energy ranging from about 2.5 MeV to 5 MeV and a dose ranging from about $1 \times 10^{13}$ atoms/centimeter$^2$ (cm$^2$) to $5 \times 10^{15}$ atoms/cm$^2$.

Doped region 122 is then formed by implanting an n-type dopant at an energy ranging from about 1.5 MeV to 3 MeV and a dose ranging from about $1\times10^{13}$ atoms/cm$^2$ to $5\times10^{15}$ atoms/cm$^2$. Finally, doped region 131 is formed by implanting an n-type dopant at an energy ranging from about 0.5 MeV to 1 MeV and a dose ranging from about $1\times10^{13}$ atoms/cm$^2$ to $5\times10^{15}$ atoms/cm$^2$. It should be understood that additional doped regions can be formed to improve the uniformity of the n-type dopant in doped region 122 or depending on the thickness of epitaxial layer 14.

Semiconductor device 100 also uses doped regions 20 and 22 to compensate for the n-type dopant in doped region 120. As described above, doped region 20 and 22 comprise p-type dopant that depletes the dopant in doped region 120 when semiconductor device 100 is in a non-conducting state. Consequently, the breakdown voltage is not affected by the increase in dopant of doped region 120 that is used to reduce the $R_{ds}$ on of semiconductor device 100. Doped regions 20 and 22 are made from a plurality of doped regions 30–33, whose number and doping concentration depend on the amount of dopant in doped region 120, the thickness of epitaxial layer 14, and the desired breakdown voltage for semiconductor device 100.

As shown in FIG. 10, semiconductor device 100 also has a plurality of doped regions 110–112 that extend from drain region 102 to doped region 12 in semiconductor substrate 11. Doped regions 110–112 can be formed in the same manner and simultaneously as doped regions 121–123. As shown in FIG. 10 with an arrow 140, doped regions 110–112 provide an alternative path of current between drain region 102 and source region 17 when semiconductor device 100 is in a conducting state. It should be understood that the formation of doped regions 110–112 can be optional. For example, if doped region 13 or semiconductor substrate 11 serves as a drain contact region such as when electrical contact is made to the backside of semiconductor device 100 rather than with the use of drain contact 101, then doped regions 110–112 would not be needed. It should also be understood that doped regions 102, 110–112, and 120 would not need to be formed if epitaxial layer 14 is doped with an n-type dopant. Conversely, doped regions 20 and 22 would not need to be formed if epitaxial layer 14 is doped p-type.

By now it should be appreciated that the present invention provides a variety of structures and methods for their fabrication. Devices formed in accordance with the present invention offer significantly reduced "on" resistance. In addition, the improvement in $R_{ds}$ on can be appreciated without reducing the breakdown voltage of the device. It should be understood that the examples shown in FIGS. 1–10 can be used to form a discrete power device, and that the structures shown in FIGS. 1–10 can represent the structure of a base cell that is repeated to form a semiconductor device that has higher current carrying capability.

It should also be understood that the teachings of the present invention can be incorporated with other semiconductor devices to provide a multi-functional integrated circuit such as a microcontroller or a microprocessor

What is claimed is:

1. A method of making a semiconductor device comprising the steps of:

providing a semiconductor substrate having a substrate surface;

forming a first doped region in the semiconductor substrate, wherein the first doped region is of a first conductivity type;

forming an epitaxial layer overlying the semiconductor substrate and providing an epitaxial surface;

forming a second doped region of a second conductivity type in the epitaxial layer, wherein the second doped region extends from the expitaxial surface and is overlying at least a portion of the first doped region;

forming a source region that is a third doped region of the first conductivity type in the second doped region, wherein the second doped region isolates the source region from the epitaxial layer to provide a channel region;

forming a fourth doped region of the second conductivity type in the epitaxial layer overlying the first doped region and underlying at least a portion of the channel region, wherein the fourth doped region contains a quantity of dopant;

forming a fifth doped region of the second conductivity type in the epitaxial layer overlying the first doped region and underlying at least a portion of the channel region, wherein the fifth doped region contains another quantity of dopant, and the fifth doped region is separated from the fourth doped region by a portion of the epitaxial layer; and forming a gate structure overlying at least a portion of the channel region.

2. The method of claim 1 wherein the step of forming the fourth doped region includes performing a plurality of implantation steps to form a plurality of doped regions to provide the fourth doped region.

3. The method of claim 2 wherein the step of forming the fifth doped region includes performing a plurality of implantation steps to form a plurality of doped regions to provide the fifth doped region.

4. The method of claim 1 further comprising the formation of a plurality of doped regions to form a sixth doped region of the first conductivity type that extend from the epitaxial surface and contact the first doped region.

5. The method of claim 4 wherein the formation of the plurality of doped regions to form the sixth doped region includes forming a plurality of doped regions that each have a width that is different.

* * * * *